United States Patent [19]

Savage, Jr.

[11] Patent Number: 4,491,900
[45] Date of Patent: Jan. 1, 1985

[54] LENS AND MOUNT FOR USE WITH ELECTROMAGNETIC WAVE SOURCE

[76] Inventor: John M. Savage, Jr., 8118 W. 83rd St., Apt. C, Playa del Rey, Calif. 90291

[21] Appl. No.: 424,277

[22] Filed: Sep. 27, 1982

[51] Int. Cl.³ .............................................. F21V 9/00
[52] U.S. Cl. .................................. 362/230; 362/311; 362/374; 362/326; 362/375; 362/335; 362/455; 250/332; 250/455.1
[58] Field of Search ................. 250/332, 455.1, 453.1; 362/329, 335, 368, 374, 375, 455, 310, 311, 230, 326

[56] References Cited

U.S. PATENT DOCUMENTS

| | | |
|---|---|---|
| 935,608 | 11/1906 | Gilman . |
| 2,569,079 | 9/1951 | Special ............................ 250/455.1 |
| 2,599,361 | 6/1952 | Beal . |
| 2,621,283 | 9/1952 | Johnson ......................... 362/335 X |
| 2,847,559 | 8/1958 | Harrington et al. . |
| 2,946,994 | 7/1960 | Dumke et al. . |
| 2,957,072 | 10/1960 | Rigel . |
| 3,003,059 | 10/1961 | Worden ........................... 362/335 X |
| 3,115,308 | 12/1963 | Stark . |
| 3,207,954 | 9/1965 | Elliott . |
| 3,229,083 | 1/1966 | George, Jr. . |
| 3,285,548 | 11/1966 | Matto et al. . |
| 3,286,255 | 11/1966 | Sanchez . |
| 3,396,269 | 8/1968 | Sorenson . |
| 3,435,137 | 3/1969 | Altshuler et al. .............. 250/332 X |
| 3,435,449 | 3/1969 | Sloan . |
| 3,473,015 | 10/1969 | Haas et al. . |
| 3,604,918 | 9/1971 | Cook . |
| 3,611,360 | 10/1971 | Bailey . |
| 3,659,093 | 4/1972 | Rieth . |
| 3,761,957 | 9/1973 | Jarrett ............................ 362/329 X |
| 3,774,021 | 11/1973 | Johnson . |
| 3,777,137 | 12/1973 | Costanzo et al. . |
| 3,805,347 | 4/1974 | Collins . |
| 3,818,486 | 6/1974 | Bailey . |
| 3,887,803 | 6/1975 | Savage, Jr. . |
| 3,982,122 | 9/1976 | Bull et al. . |
| 4,035,681 | 7/1977 | Savage, Jr. . |
| 4,195,330 | 3/1980 | Savage, Jr. . |
| 4,290,092 | 9/1981 | Bull .................................. 362/368 X |
| 4,326,243 | 4/1982 | Pistor et al. ..................... 362/374 X |
| 4,419,722 | 12/1983 | Bury ................................ 362/800 X |

FOREIGN PATENT DOCUMENTS

| | | |
|---|---|---|
| 1360727 | 8/1964 | France . |
| 2126650 | 2/1971 | France . |
| 1043359 | 9/1966 | United Kingdom . |

Primary Examiner—Peter A. Nelson
Attorney, Agent, or Firm—William W. Haefliger

[57] ABSTRACT

A lens cap and mount for use with an electromagnetic radiation emitter or sensor in the cap has an integral lens for collimating or converging the emitted or received radiation.

16 Claims, 12 Drawing Figures

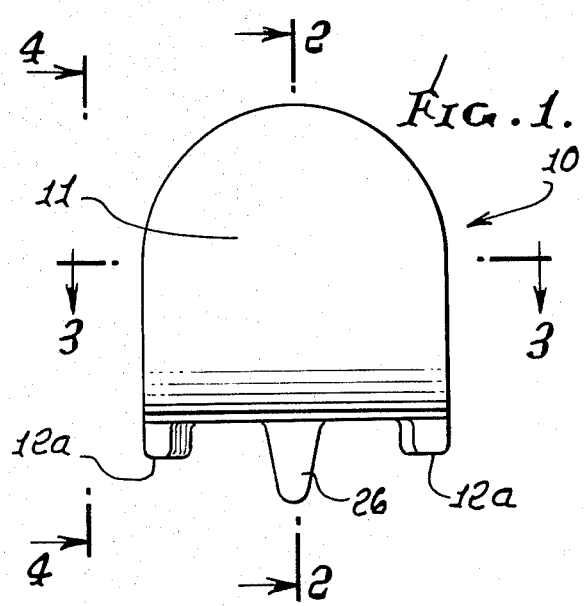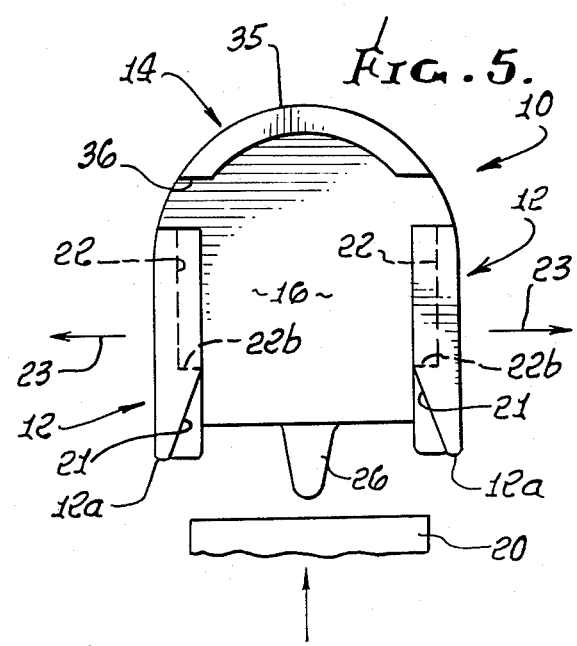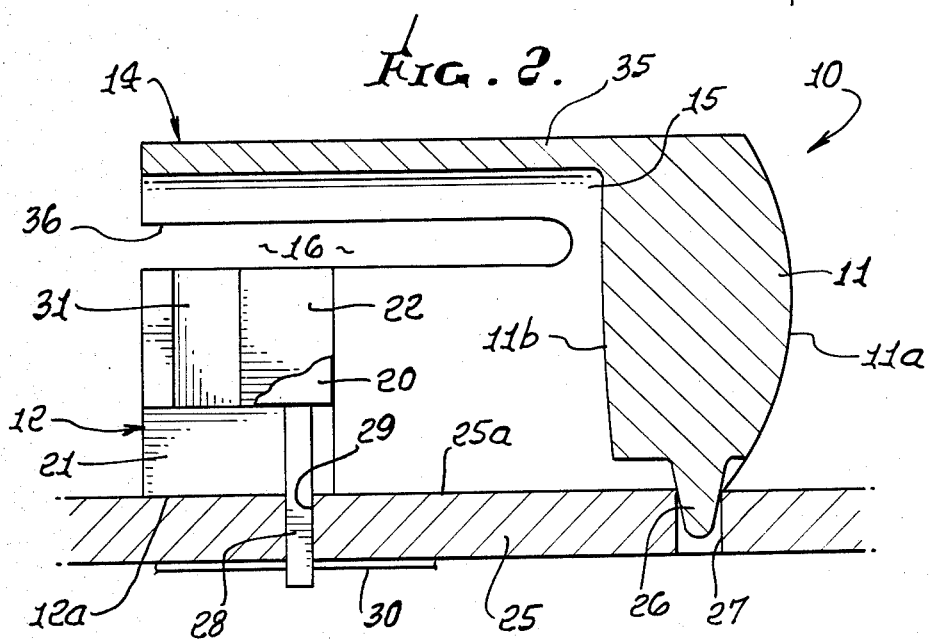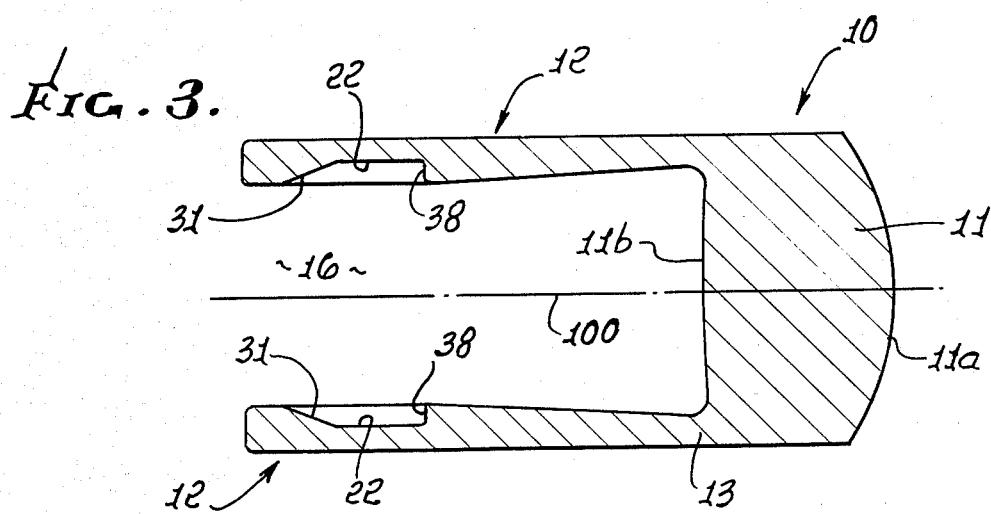

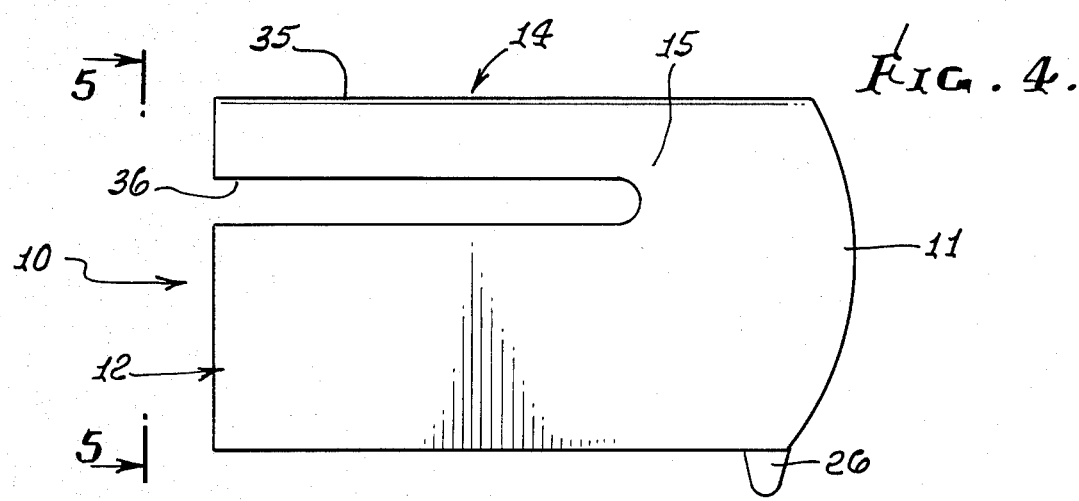
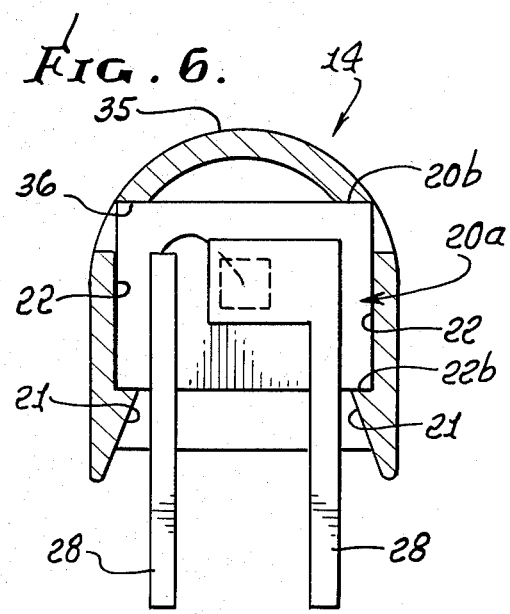
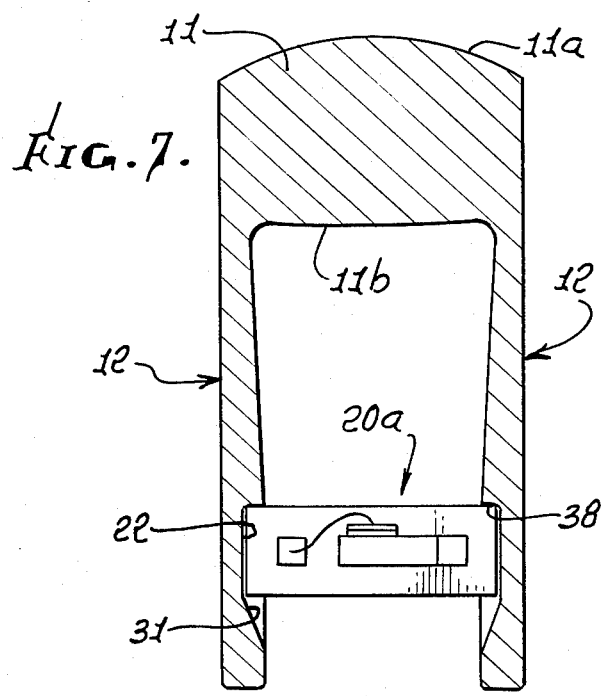
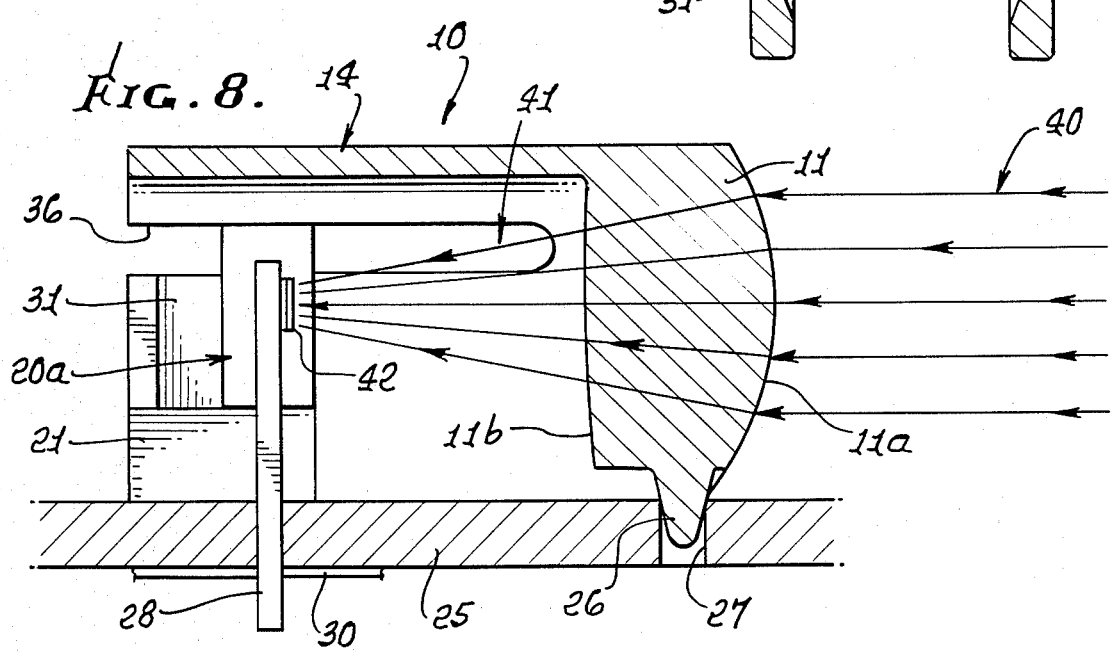

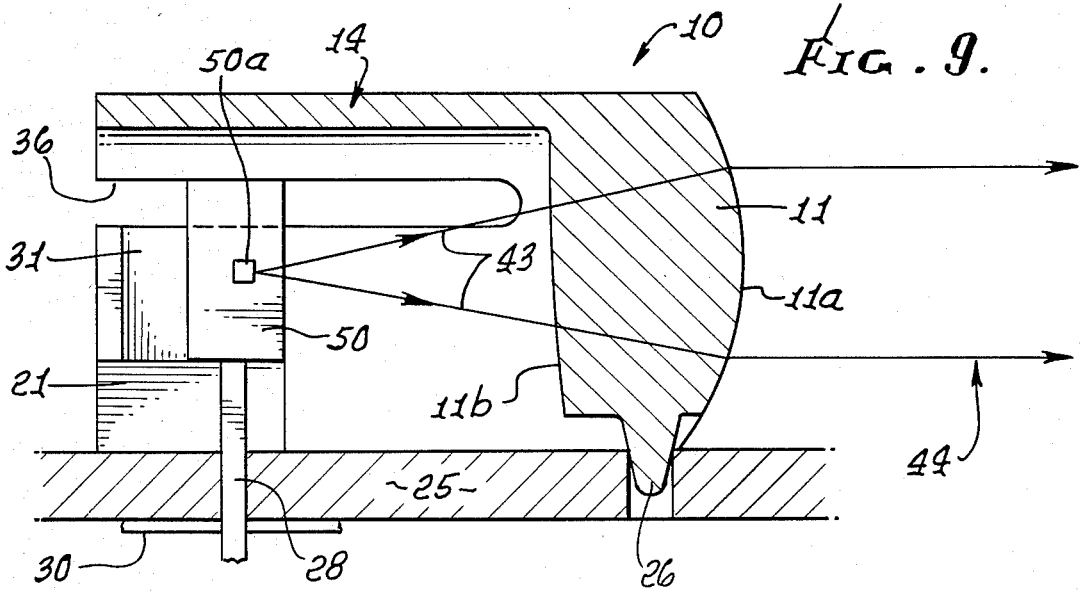
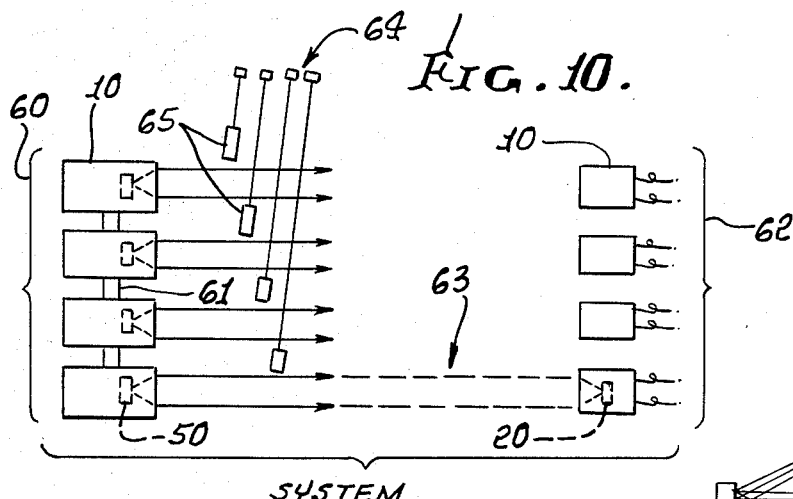
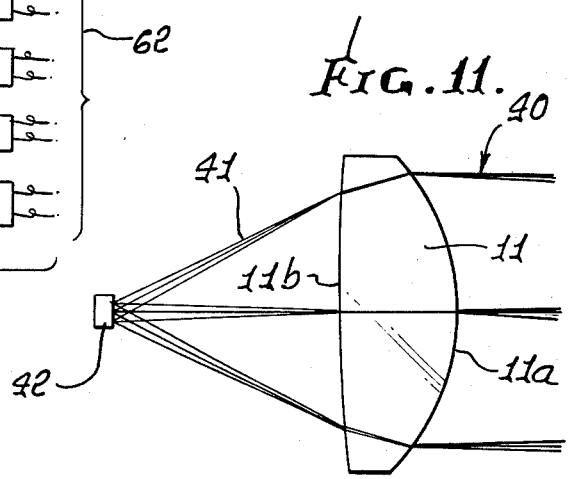
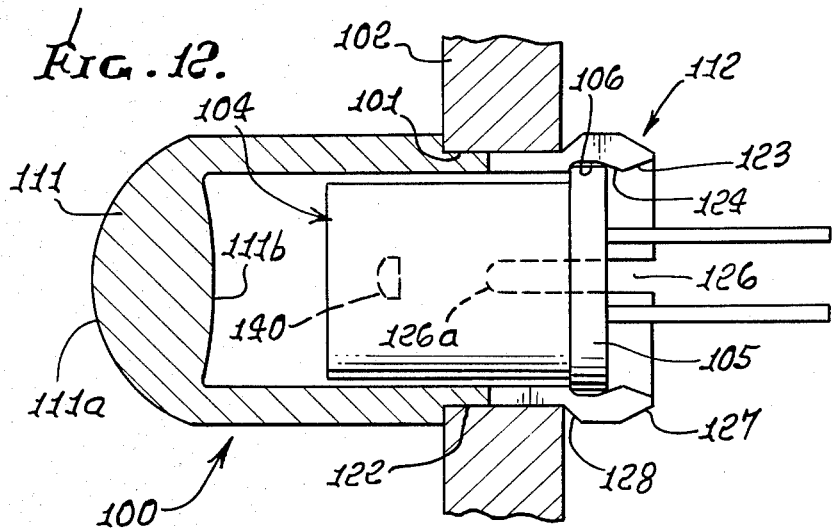

4,491,900

LENS AND MOUNT FOR USE WITH ELECTROMAGNETIC WAVE SOURCE

BACKGROUND OF THE INVENTION

This invention relates generally to the mounting of radiation emitters and sensors, and associated lenses; more particularly, it concerns compact mounting of such emitter and sensor devices in lens caps having lenses for collimating or converging emitted radiation, or radiation to be detected (as for example infra-red radiation).

In the past, LEDs were located in so called lens caps which distributed light generated by the LEDs. See for example U.S. Pat. No. 4,195,330 to Savage.

There is now a perceived and growing need for small sized devices which will accurately collimate or converge infra-red radiation, or other radiation.

SUMMARY OF THE INVENTION

It is a major object of the present invention to provide a means for achieving or meeting the above described need, and also for achieving concentration of radiant energy from weak sources, for useful detection at considerable distances, by means of low-cost, compact devices.

Fundamentally, the invention is embodied in the improvement which comprises:

(a) a compact lens cap having means for receiving the device and for accurately positioning the device relative to an integral lens on the cap, (b) the lens characterized as being collimating or converging to radiation for forming a collimated or convergent beam as respects radiation passing to or from the device.

As will appear, the lens cap is typically very small in size and consists of molded plastic material; it may be located or mounted sidewardly on a circuit board, or in a panel; and it is adapted to sidewardly receive an emitter or detector pre-mounted on the board, or to be solder-connected to the board.

A further object is to provide the cap with a slotted skirt that defines at least two rearwardly extending spring fingers (cantilever mounted to the lens), the fingers adapted to be spaced apart to sidewardly receive the emitter or detector device, and the fingers define grooves to precisely locate the device relative to the lens. In this regard, a third, or "cover" finger is adapted to be flexed to forcibly retain the device in pre-determined position in the grooves to prevent its misalignment relative to the lens. The spring fingers have cam surfaces, to be described, which facilitate these objectives.

A further object of the invention is to provide multiple lens caps in arrays to concentrate relatively weak radiant energy in collimated beams for detection at distances by arrayed detectors.

These and other objects and advantages of the invention, as well as the details of illustrative embodiments, will be more fully understood from the following description and drawings, in which:

DRAWING DESCRIPTION

FIG. 1 is a front-end view of a lens cap;

FIG. 2 is a vertical section taken on lines 2—2 of FIG. 1;

FIG. 3 is a horizontal section taken on lines 3—3 of FIG. 1;

FIG. 4 is a side elevation taken on lines 4—4 of FIG. 1;

FIG. 5 is a rear end elevation taken on lines 5—5 of FIG. 4;

FIG. 6 is a view like FIG. 5 showing a radiation detector in position in the lens cap;

FIG. 7 is a view like FIG. 3, showing the detector in position;

FIG 8 is a view like FIG. 2, showing the detector in position;

FIG. 9 is a view like FIG. 2, showing an infra-red emitter device in position.

FIG. 10 is in plan view showing gang mounting of lens caps embodying the invention;

FIG. 11 is an optical diagram; and

FIG. 12 is a side elevation, in section, showing a panel mounted form of the device.

DETAILED DESCRIPTION

In FIGS. 1-5, a lens cap 10 includes a forward lens 11, two like spring fingers 12 projecting rearwardly from junctures 13 with the lens, and a cover finger 14 projecting rearwardly from its juncture 15 with the lens. Fingers 12 and 14 may be considered to form a skirt defining a zone 16 for receiving an infra-red radiation detector or emitter (i.e. device) and the lens and fingers (i.e. skirt) typically consist of molded plastic such as polycarbonate or LEXAN, which is typically transparent.

The overall length of the cap typically is less than ½ inch, but may vary.

The two fingers 12 are constructed or formed to have tongue and groove interfit with the device 20 (such as detector 20a in FIGS. 6-8). To this end, the fingers 12 define first cam surfaces 21, located below zone 16, and grooves 22, the surfaces 21 being downwardly relatively divergent to be spread apart by the device 20 in response to its relatively upward insertion into zone 16. FIG. 5 shows the device moving relatively upward to engage and spread the fingers 12 in lateral directions 23. Upon full reception of device 20 into zone 16, the fingers snap back toward one another, and the device is releasably retained in grooves 22. See FIG. 6. Note that the flat lower edges 12a of the fingers are adapted to seat on upper surface 25a of circuit board 25, and that an integral downward projection 26 on lens 11 locates in a recess 27 in that board to position the lens cap on the board. Also, terminals 28 project downwardly from the device 20 and through an opening or openings 29 in board 25, to be contacted and positioned by solder layer 30 at the "wave solder side" of the board.

In addition, the fingers define second cam surfaces 31 immediately rearwardly of grooves 22 and angled rearwardly and radially inwardly to be radially spread apart by the device 20 in response to relatively rearward retraction of the device from the lens cap. Accordingly, removal and replacement of the device is facilitated, after lifting of the lens cap from the board 25, i.e. for example to lift projection 26 from recess 27. Also, cam surfaces 31 engage the device 20 and urge it forwardly toward shoulders 38 for accurately positioning the device along axis 100.

The cover finger 14, in addition to being upwardly cylindrically convex at 35, has flat lower surfaces 36 engageable by the top surface 20b of device 20, to locate same vertically in zone 16. Lower edges or shoulders 22b of grooves 22 also serve to primarily locate the device vertically and, to this end, finger 14 may also comprise a spring (cantilevered) finger to resiliently flex upwardly in response to upward insertion of device 20 into zone 16, and to hold the device downwardly against shoulders 22b.

Forward shoulders 38 on fingers 12 position device forwardly, i.e. along axis 100, seen in FIG. 3.

Referring now to FIGS. 2, 8 and 11, it will be seen that the integral plastic lens 11 has a front face 11a with greater curvature than rear face 11b. Front face 11a is typically aspherical, whereas rear face 11b is spherical. The surfaces are so constructed or formed as to receive parallel light rays 40 (see FIG. 8) and accurately converge them at 41 toward the sensing element 42 in the device 20 (radiation detector, in this case). See also FIG. 11. In the case of an infra-red emitter 50 (see FIG. 9) received in recess 16, the lens 11 receives rays 43 diverging in cone shape from emitting element 50a of 50, and typically collimates them for travel at 44. Alternatively, the lens may cause the rays 44 to converge toward an object at a specified distance.

FIG. 10 shows the provision of multiple lens caps arrayed in a group or "gang" 60; to this end, a clip or bridge 61 may hold the caps in position. An array 62 of lens caps 10 is also shown, spaced from array 60, with caps in the two arrays having a one-to-one correspondence. Caps in array 60 may contain infra-red emitters 50 and caps in array 62 may contain radiation detectors 20, for example. One application of such a system is to provide a multiple digital signal generating means, such as in a keyboard. Keys 64 operate beam interrupters 65 to move them into or out of the paths of the collimated infra-red (or visual) beams 63, to make or break beam passage to the detectors 20. One advantage of such a system is extreme simplicity. Another application is for alarm systems, to actuate warning devices when beams are broken, also for counting items or for measuring shapes.

Typical radiation emitters are LEDs; and typical radiation detectors are silicon photo-transistors.

Instead of being mounted sidewardly on a circuit board, the caps may be mounted in holes on a panel. Such an arrangement is shown in FIG. 12, with lens cap 100 having spring fingers 112 received into a hole 101 in panel 102, the spring fingers having tongue and groove interfit with the infra-red emitter or detector 104. The illustrated interfit or releasable interconnection is defined by the reception of the radially projecting boss 105 into first grooves 106 defined by cantilevered extents of the fingers projecting rearwardly of the panel 102. Note that the spring fingers also define second grooves 122 receiving the panel.

The fingers further define first cam surfaces 123 located rearwardly of the grooves 106 to be radially spread by the boss 105 in response to forward insertion of the boss or device 104 into the cap. Surfaces 123 are angled rearwardly and radially outwardly, as shown. In addition the fingers define second cam surfaces 124 immediately rearward of the grooves 106 and angled rearwardly and radially inwardly to be radially spread apart by the boss 105 in response to relatively rearward retraction of the device from the lens cap.

It should be noted that four spring fingers may be provided by forming four lengthwise extending slits 126 in the skirt portion of the cap, at 90° intervals about the cap axis. The slits extend forwardly or leftwardly from the rightward end of the cap. The leftward ends 126a of the slits terminate within the bore or opening 101 in the panel. In that position, the cap holds the device 104.

FIG. 12 also shows that the spring fingers define third cam surfaces 127 rearwardly of the second grooves 122 and angled rearwardly and radially inwardly, and also fourth cam surfaces 128 rearwardly of and adjacent the grooves 122, surfaces 128 being angled rearwardly and radially outwardly. Accordingly, the spring fingers accommodate ready installation of the lens cap to the panel, as well as retention of the boss 105.

The lens cap and spring fingers described herein typically consist of insulative plastic material. The lens 111 is the same as lens 11 described above, and has surfaces 111a and 111b like surfaces 11a and 11b.

See emitting or detecting element 140.

I claim:

1. For use in combination with a radiation emitter or detector device, the improvement comprising:
   (a) a lens cap having a skirt defining an emitter or detector device receiving zone,
   (b) the cap including a lens integral with the skirt (and characterized as being collimated or convergent beam as respects) for refracting radiation passing to or from said zone,
   (c) said skirt including at least two rearwardly and horizontally endwise extending spring fingers adapted to be spread relatively apart to receive and retain said device therebetween, in said zone,
   (d) said spring fingers having downwardly relatively divergent cam surfaces to be spread apart in response to relatively upward insertion of said device into said zone, and said spring fingers having grooves therein facing said zone to receive edge portions of said device, said grooves having locating shoulders facing upwardly to position said device, vertically,
   (e) and said skirt including another spring finger overlying said zone to be engaged and deflected upwardly by said device and to resiliently urge said device relatively downwardly against said locating shoulders, whereby insertion of said device substantially normal to the endwise direction of the spring fingers is enabled.

2. The improvement of claim 1 wherein said cap consists of molded synthetic resin.

3. The improvement of claim 2 wherein the lens has a convex outwardly facing surface which is aspherical.

4. The improvement of claim 3 wherein the lens has a convex inwardly facing surface which is spherical.

5. The improvement of one of claims 1–4 including a sideward projection on the lens to interfit a locating recess in a support.

6. The improvement of claim 5 including said support in the form of a circuit board having circuitry thereon.

7. The improvement of claim 6 including said device in said zone, and having at least one terminal projecting into a hole in the board to be contacted by solder on the board, the cap skirt seated on the board.

8. The improvement of claim 6 including said device in said zone between said fingers, the fingers seated on (a) said circuit board, the device having a terminal projecting in a hole in the board to be contacted by electrical circuitry on the board.

9. The improvement of claim 1 wherein said spring fingers also have rearwardly relatively convergent cam surfaces to be spread apart in response to relatively rearward removal of said device from said zone.

10. The improvement of claim 9 wherein said rearwardly convergent cam surfaces intersect said zone.

11. The improvement of claim 1 including said device in said zone, and which comprises a radiation detector.

12. The improvement of claim 1 including said device in said zone, and which comprises an infra-red radiation emitter.

13. The improvement of claim 1 including multiple of said lens caps in at least one array.

14. The improvement of claim 13 including radiation detectors in said zones in the caps.

15. The improvement of claim 13 including radiation emitters in said zones in the caps.

16. The improvement of claim 13 including two spaced arrays, radiation emitters in the caps in one array and radiation detectors in the caps in the other array, and located to receive radiation emitted from the emitters.

* * * * *

UNITED STATES PATENT AND TRADEMARK OFFICE
CERTIFICATE OF CORRECTION

PATENT NO. : 4,491,900
DATED : January 1, 1985
INVENTOR(S) : John M. Savage, Jr.

It is certified that error appears in the above-identified patent and that said Letters Patent are hereby corrected as shown below:

Column 4, claim 8, line 62; delete [(a)]

Signed and Sealed this

Twentieth Day of August 1985

[SEAL]

Attest:

DONALD J. QUIGG

Attesting Officer     Acting Commissioner of Patents and Trademarks

UNITED STATES PATENT AND TRADEMARK OFFICE
CERTIFICATE OF CORRECTION

PATENT NO. : 4,491,900
DATED : January 1, 1985
INVENTOR(S) : John M. Savage, Jr.

It is certified that error appears in the above-identified patent and that said Letters Patent are hereby corrected as shown below:

Column 4, claim 1, lines 21-23, delete [(and characterized as being collimated or convergent beam as respects)]

Column 4, claim 1, line 20, after "zone," insert --and characterized as being collimating or converging to radiation for forming a collimated or convergent beam--

Signed and Sealed this

Fourteenth Day of January 1986

[SEAL]

Attest:

DONALD J. QUIGG

Attesting Officer

Commissioner of Patents and Trademarks